(12) United States Patent
Wilson et al.

(10) Patent No.: US 6,771,131 B2
(45) Date of Patent: Aug. 3, 2004

(54) CMOS AMPLIFIER FOR OPTOELECTRONIC RECEIVERS

(75) Inventors: Timothy M. Wilson, Hillsboro, OR (US); Tanay Karnick, Portland, OR (US); Bryan K. Casper, Hillsboro, OR (US); James E. Jaussi, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/142,492

(22) Filed: May 9, 2002

(65) Prior Publication Data

US 2003/0210097 A1 Nov. 13, 2003

(51) Int. Cl.[7] ................................................. H03F 3/08
(52) U.S. Cl. ....................................... 330/308; 330/258
(58) Field of Search ................................. 330/258, 308

(56) References Cited

U.S. PATENT DOCUMENTS 5,789,981 A * 8/1998 Singer et al. ............... 330/257
6,344,651 B1 * 2/2002 Woolaway et al. ......... 330/308

OTHER PUBLICATIONS

Patent Application "High Bandwidth, Low Power, Single Stage Cascode Transimpedance Amplifier For Short Haul Optical Links", Filed Mar. 26, 2002, Inventors Timothy M. Wilson, Tanay Karnick, 16 pages; 7 pages of figures.

* cited by examiner

*Primary Examiner*—Khanh V. Nguyen
(74) *Attorney, Agent, or Firm*—Seth Z. Kalson (57) ABSTRACT

A CMOS amplifier for optoelectronic receivers, the amplifier comprises two transimpedance amplifiers and two differential amplifier latches. One of the two transimpedance amplifiers has an input port to receive a current signal, such as, for example, a current signal from a photodetector, and provides a output voltage indicative of the received current signal. The other of the two transimpedance amplifiers may be viewed as having no input signal, so that it provides a reference voltage. The two transimpedance amplifiers are in close proximity to each other, so that power supply noise is a common mode signal in the output voltages of the two transimpedance amplifiers. The differential amplifier latches reject the common mode signal by comparing the reference voltage to the output voltage, and provide output logic voltages indicative of binary hard decisions. Two differential amplifier latches are employed, each with an evaluation phase on alternate transitions of a clock signal, so as to provide a higher throughput than if only one differential amplifier latch was employed.

14 Claims, 8 Drawing Sheets

Fig. 1 (PRIOR ART)

(PRIOR ART)

CMOS AMPLIFIER FOR OPTOELECTRONIC RECEIVERS

FIELD

The present invention relates to analog circuits, and more particularly, to a CMOS amplifier with utility for optoelectronic receivers.

BACKGROUND

With increasing data rates in electronic systems, it is expected that optical interconnects (optical fibers) may in the near future replace wire interconnects at the board-to-board and chip-to-chip level. For example, a computer system such as that illustrated in FIG. 1 may comprise one or more boards 102 and memory hierarchy 104 that exchange data packets over optical interconnects 106. These packets may be routed via switch 108, or perhaps the various integrated circuits may be directly connected to one another. Each board 102 may comprise one or more microprocessors.

Figure 2:
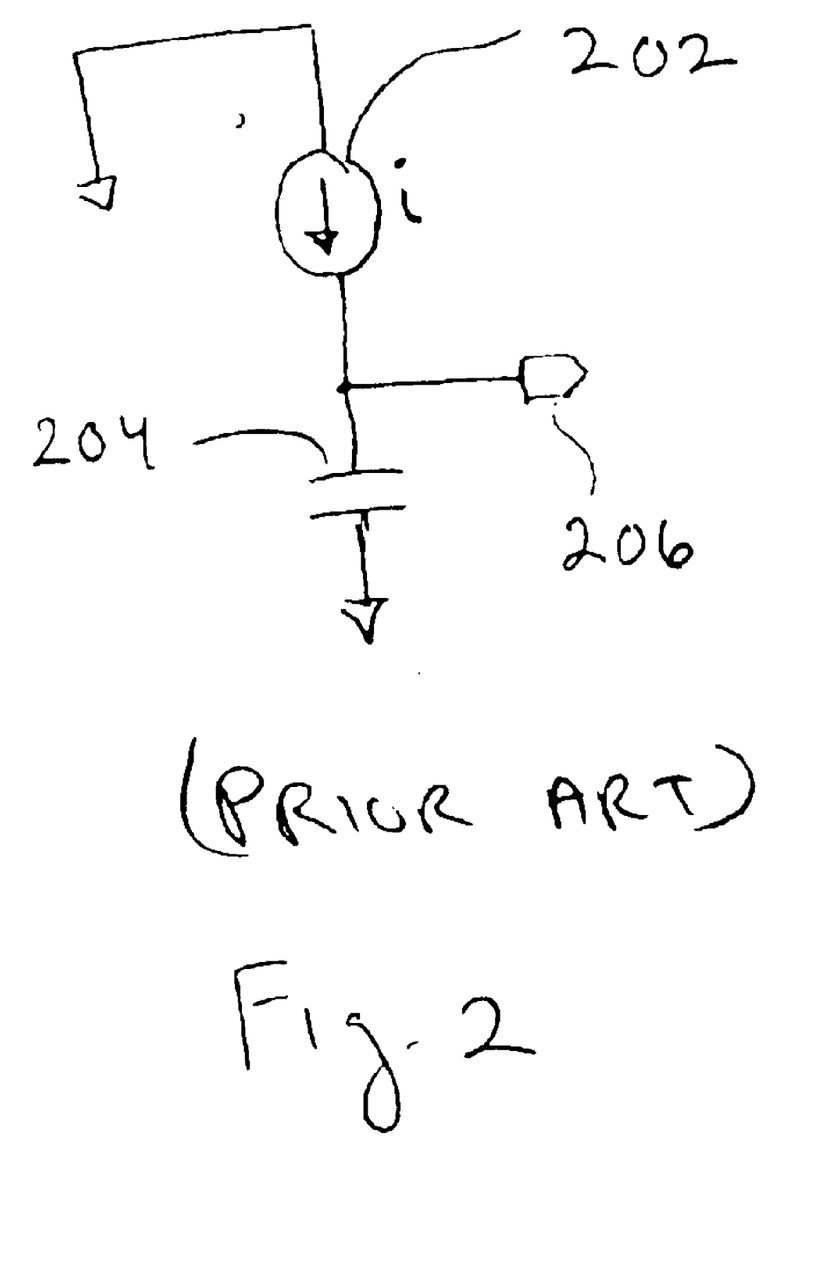
FIG. 2 is a small-signal model for a prior art photodetector used in the computer system of FIG. 1.

In many applications, a photodetector provides an electrical signal indicative of a received optical signal. A typical small-signal model for a photodetector is provided in FIG. 2, comprising small-signal current source 202 and parasitic capacitor 204. The small-signal current provided by current source 202 is representative of the received optical signal. The output signal is provided at output port 206, which for many applications is connected to the input port of a transimpedance amplifier (not shown). Transimpedance amplifiers provide a small-signal output voltage signal in response to a small-signal input current signal.

In telecommunication applications, the received optical signals are typically very small due to attenuation in optical fibers, which may be hundreds of kilometers long. Consequently, a primary goal for transimpedance amplifiers for long haul communications is to provide high transimpedance with low noise amplification, while attaining as large a bandwidth as practical.

Figure 1:
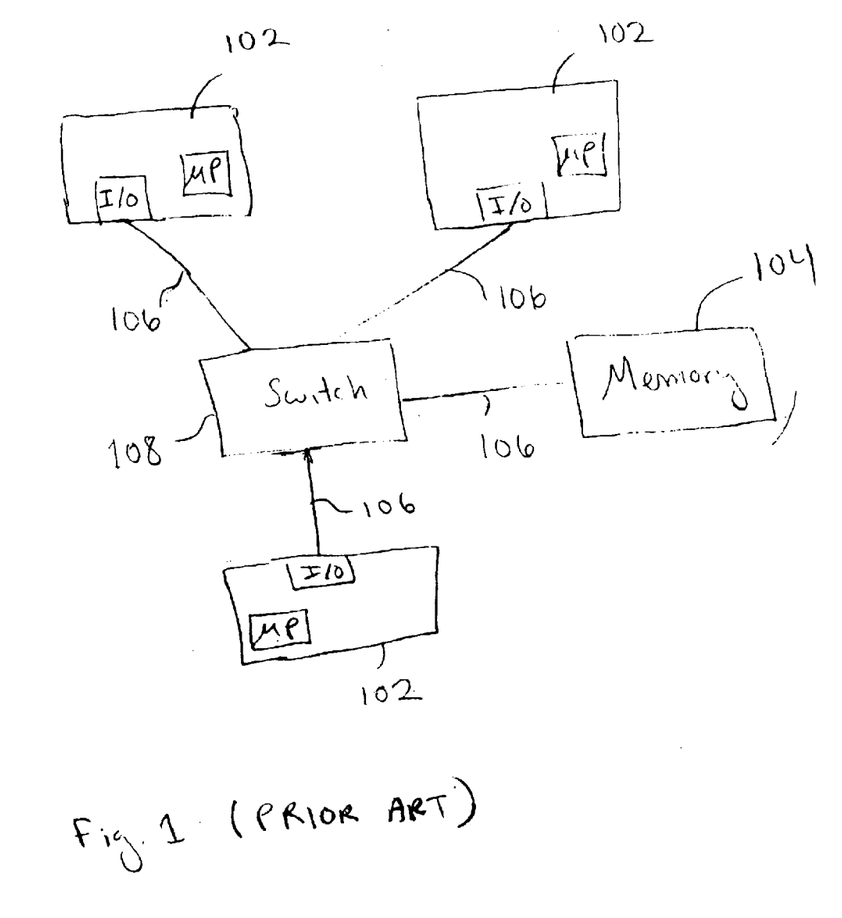
FIG. 1 is a prior art computer system using optical signals for board-to-board communication.

However, at the board-to-board and chip-to-chip level, such as the computer system of FIG. 1, attenuation is relatively negligible, and the received signals are typically orders of magnitude larger than for the case of long haul optical communication systems. In such short haul optical applications, it is desirable for economic and high-bandwidth reasons for transimpedance amplifiers to be integrated with other circuits on an integrated circuit die, such as input-output chips on boards 102 or switch 108, and perhaps on a microprocessor itself. Accordingly, for such applications, it is desirable to provide CMOS (Complementary Metal Oxide Semiconductor) transimpedance amplifiers having an acceptable transimpedance over a relatively large bandwidth, such as, for example, 20 Gbps, with relatively low power dissipation, and with good power supply noise rejection.

DESCRIPTION OF EMBODIMENTS

Figure 3:
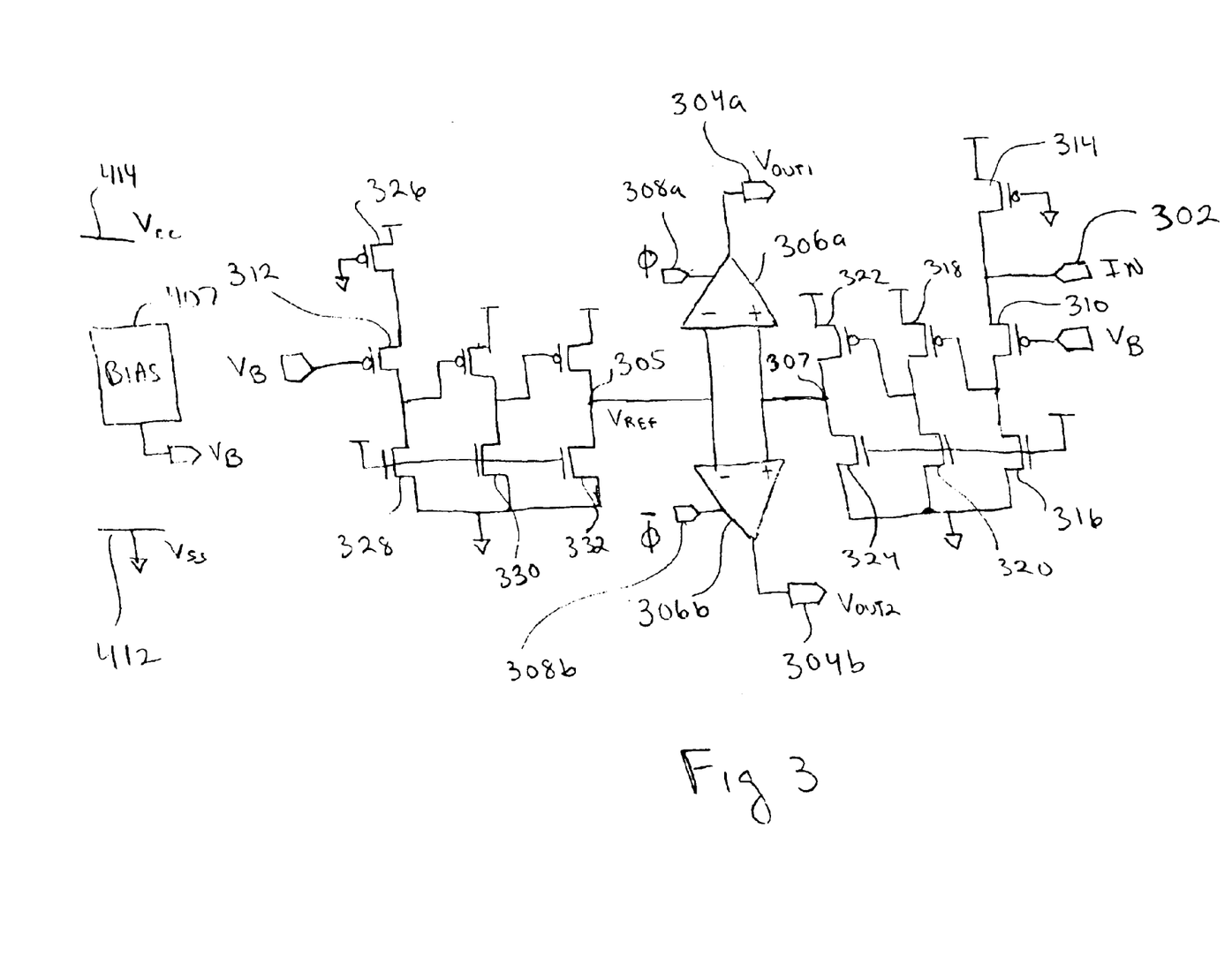
FIG. 3 is an amplifier at the circuit level and according to an embodiment of the present invention.

An amplifier at the circuit level is provided in FIG. 3, where input port 302 receives an input current signal, such as from the output port of a photodetector. As will be described in more detail later, the amplifier of FIG. 3 may be considered to comprise two transimpedance amplifiers, where one of the transimpedance amplifiers is employed to provide a voltage signal at node 307 indicative of the current signal provided to input port 302, and the other transimpedance amplifier is employed to provide a reference voltage $V_{REF}$ at node 305. The amplifier of FIG. 3 also comprises differential amplifier latches 306a and 306b. These differential amplifiers provide at output ports 304a and 304b output voltages $V_{OUT1}$ and $V_{OUT2}$, respectively, on alternate edges of the clock signal $\phi$. These output voltages take on one of two logic levels, $V_{ss}$ (LOW) or $V_{CC}$ (HIGH). The differential amplifier latches compare the voltage at node 307 to $V_{REF}$, and provide a logic voltage indicative of the comparison. In this way, a "hard decision" is made as to which bit, "1" or "0", has been "received" at input port 302. Because of the symmetrical layout of the amplifier in FIG. 3, the effect of power supply noise upon incorrectly deciding whether a "1" or "0" has been transmitted is reduced. This will now be described in further detail.

The embodiment of FIG. 3 has left and right hand symmetries, except that input port 302 is connected to the source of common-gate transistor 310 but there is no input port connected to the source of common-gate transistor 312. (Standard nomenclature is employed in referring to pMOSFET 310 as a common-gate transistor because its small-signal gate voltage is at small-signal ground.) Alternatively, the embodiment of FIG. 3 may be viewed as having left and right symmetries, in which another input port is added at the source of common-gate transistor 312, but with zero input signal current. Regardless of the viewpoint, if the symmetrical nature of FIG. 3 is such that the left and right hand analog stages are laid out on a die in close physical proximity to each other, power supply noise will be substantially a common mode signal, which should be substantially rejected by differential amplifier latches 306a and 306b. For example, it was found that an amplifier according to the embodiment of FIG. 3 amplified a 100 micro ampere input signal current to logic level voltages with a 1.0V power supply at 10 GHz, or 20 Gbps, in the presence of power supply noise in which the peak-to-peak noise was 60 mV.

Figure 7:
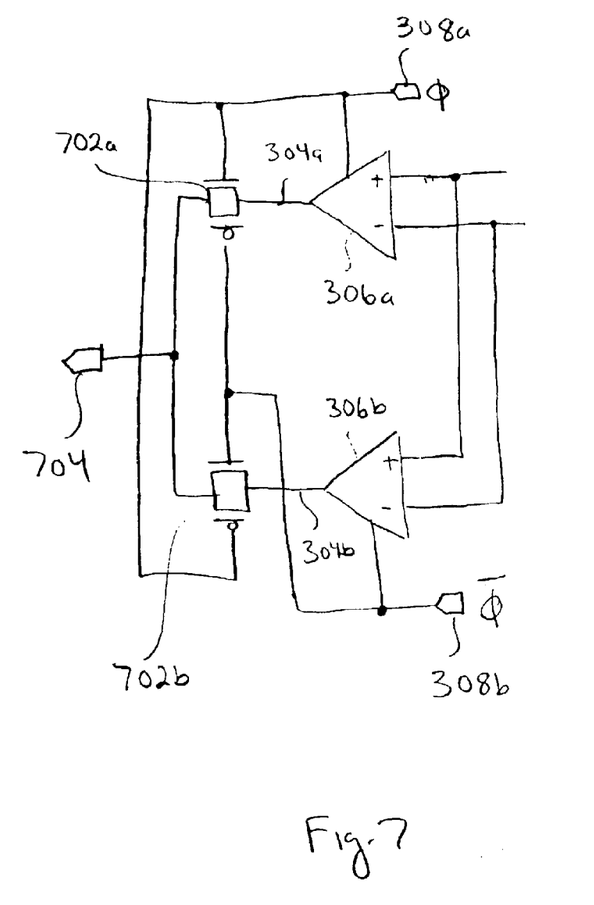
FIG. 7 shows an example of how the output voltages from the differential amplifiers latches in FIG. 3 may be provided at a single output port.

It is convenient to first describe the first three pairs of amplifier stages in FIG. 3 before describing the differential amplifier latches. Each side of the circuit in FIG. 3 comprises three stages, where the first stage is a common-gate amplifier. Consider the first stage in the right hand side of FIG. 3 (the stage connected to input port 302). This stage is repeated in FIG. 4, where for ease of discussion output port 404, FIG. 7, is added at the drain of pMOSFET 406 in FIG. 7, which is the same as pMOSFET 310 in FIG. 3. Comparing FIGS. 3 and 4, output port 404 in FIG. 7 may be viewed as connected to the following stage in the transimpedance amplifier.

Figure 4:
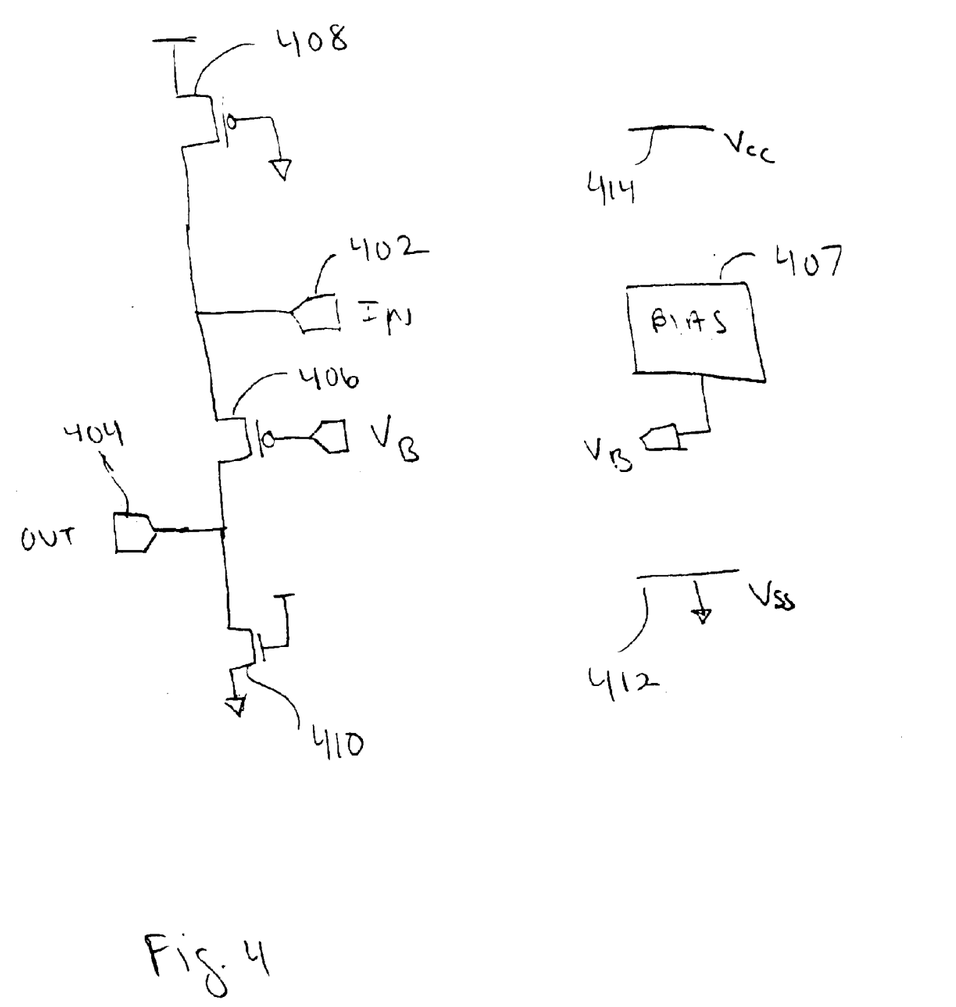
FIG. 4 is the first input stage of a transimpedance amplifier in FIG. 3 at the circuit level.

Referring now to FIG. 4, common-gate pMOSFET 406 has its gate biased to bias voltage $V_B$, which is provided by bias circuit 407. Biasing current and active loads are provided by pMOSFET 408 and nMOSFET 410, with their gates connected to ground rail (substrate) 412 and power rail 414, respectively. The bias voltage $V_B$ is some voltage chosen between $V_{SS}$ and $V_{CC}$ so that pMOSFET 406 is biased in its active region. Note that only one biasing circuit is required for the amplifier stage of FIG. 4 (and consequently FIG. 3). With only one biasing circuit needed, power consumption may be kept relatively low compared to other amplifiers that may need more than one bias voltage.

Figure 5:
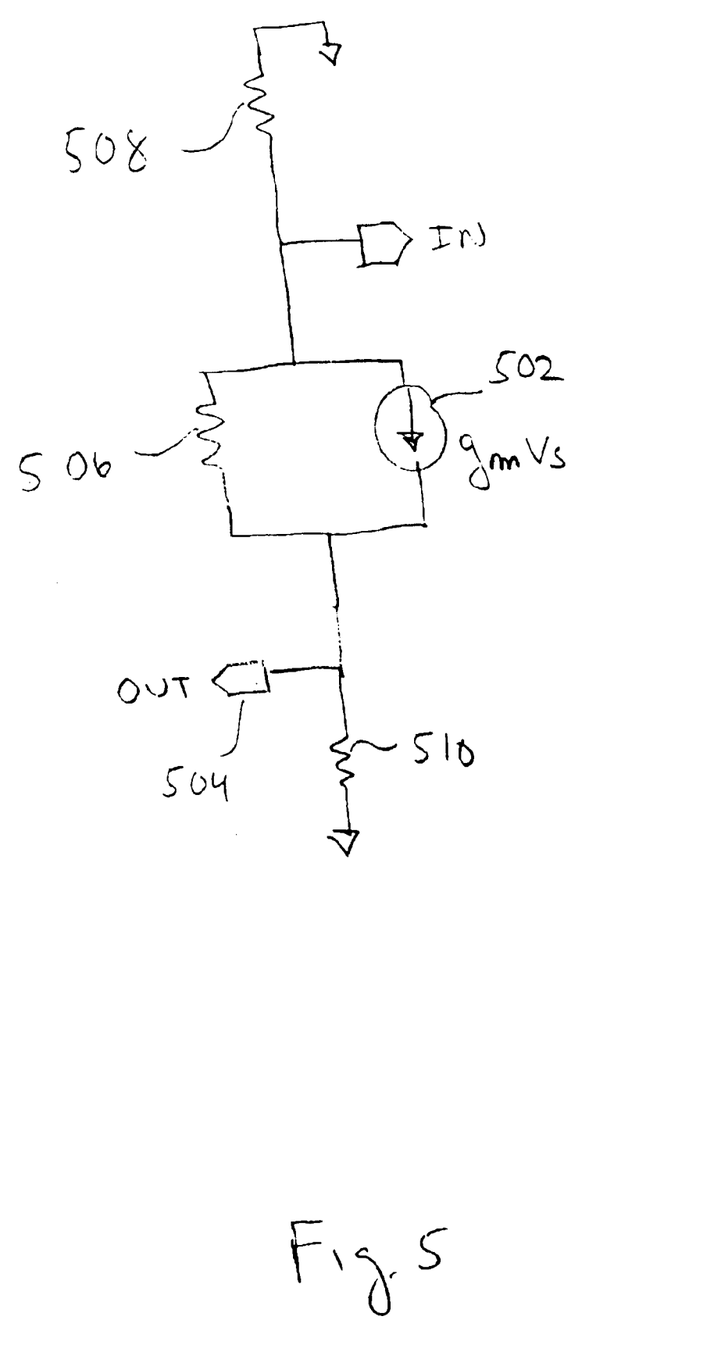
FIG. 5 is a low frequency small-signal model for the input stage of FIG. 4.

It is instructive to consider a small-signal low frequency model for the circuit of FIG. 4, shown in FIG. 5. Small-signal voltage-controlled current source 502 and small-signal drain-source resistor 506 model pMOSFET 406 in its active region, where $g_m$ is the transconductance and $v_s$ is the small-signal source voltage for pMOSFET 406. Because the source and gate voltages of pMOSFET 408 and nMOSFET 410 are ideally constant, pMOSFET 408 may be represented by small-signal drain-source resistor 508 and nMOSFET 410 may be represented by small-signal drain-source resistor 510, where both low frequency models apply for either their triode regions or active regions, although the numerical values for the small-signal drain-source resistances depend upon which region is applicable. It is expected that both pMOSFET 408 and nMOSFET 410 will operate in their triode regions.

Let $Z_{IN}$ and $Z_T$ denote, respectively, the small-signal, low frequency input impedance and transimpedance for the amplifier of FIG. 4, assuming that any external small-signal load connected to output port 404 is very high and may be neglected. For pMOSFET 408 and nMOSFET 410 operating in their triode regions, and with pMOSFET 406 operating in its active region, the resistances of resistors 508 and 510 may be taken to be substantially less than the resistance of resistor 506. That is, the small-signal drain-source resistances of pMOSFET 408 and nMOSFET 410 are each substantially less than the small-signal drain-source resistance of common-gate pMOSFET 406. With this simplifying assumption, it can be shown from the small-signal model of FIG. 5 that the small-signal input impedance and transimpedance are approximately $Z_{IN} \approx \alpha 1/g_m$ and $Z_T \approx \alpha r_n$, where $r_n$ is the resistance of resistor 510 and $\alpha$ is a positive number less than 1, $0<\alpha<1$, given by $\alpha=r_p g_m/(1+r_p g_m)$ where $r_p$ is the resistance of resistor 508.

For comparison, consider the case in which the resistances of resistors 508 and 510 are now substantially larger than the resistance of resistor 506. For example, this may be realized in which pMOSFET 408 and nMOSFET 410 were operated in their active regions, or perhaps replaced with high small-signal output impedance current sources. Let z denote this impedance. Making the simplifying assumption that the small-signal drain-source resistances of pMOSFET 408 and nMOSFET 410 are the same order of magnitude, one may approximate the small-signal input impedance as $Z_{IN} \approx z/(g_m r_{dsc})$, where $r_{dsc}$ is the small-signal drain-source resistance of common-gate pMOSFET 406. Also under these assumptions, the transimpedance may be approximated as $Z_T \approx z$, where recall that $z>>r_{dsc}$ because we have assumed high small-signal output impedance current sources.

Comparing $Z_{IN}$ and $Z_T$ for the two cases where pMOSFET 408 and nMOSFET 410 operate in their triode regions, and where these transistors are replaced by a high small-signal output impedance, it is seen that both the small-signal input impedance and transimpedance are less for the former case. Although the above expressions for $Z_{IN}$ and $Z_T$ were based upon a simple low frequency model and some simplifying assumptions, they nevertheless suggest that by operating pMOSFET 408 and nMOSFET 410 in their triode regions, a lower small-signal input impedance may be achieved at the expense of a lower transimpedance, compared to the case in which pMOSFET 408 and nMOSFET 410 are operated in their active regions or are replaced by high small-signal output impedance current sources. However, because the embodiment of FIG. 3 is motivated for short haul optical links in which signal strength is relatively large, this may be an advantageous tradeoff. It is to be remembered that a photodetector may be modeled as small-signal current source 202 and small-signal internal capacitor 204, which may be relatively large. Consequently, for the amplifier of FIG. 3 it may be easier to match the amplifier small-signal input impedance to the small-signal output impedance of the photodetector than for some prior art amplifiers.

The second stages in the right hand side of FIG. 3, e.g., transistors 318 and 320, and the third stages, e.g., transistors 322 and 324, are common-source amplifier stages. Transistors 320 and 324 provide bias currents and serve as active loads to, respectively, transistors 318 and 322. The gates of transistors 320 and 324 are connected to power rail 414. Similar statements apply to the left hand side of FIG. 3. Consequently, the transistors that provide bias currents and active loads do not require an additional bias voltage, and as described earlier, this contributes to a reduction in power dissipation.

The design of the amplifier of FIG. 3 also contributes to realizing a useful operating bandwidth for many optoelectronic applications. Because pMOSFETs 314 and 326, and nMOSFETs 316, 320, 324, 328, 330, and 332 operate such that the magnitudes of their gate-to-source voltages are each $V_{CC}$, a relatively large current flow for a given device size is achieved. Consequently, the embodiment of FIG. 3 may be designed with relatively small device sizes for these transistors. Reducing the device size of a MOSFET will, in general, reduce its small-signal parasitic capacitances, and if the drain current does not change, then the small-signal device resistance will remain substantially the same. This results in an overall reduction in the RC time constant, contributing to a wider operating bandwidth for the amplifier.

The first three stages in the right hand side of FIG. 3 serve to provide a reasonable transimpedance amplification. It is found that a transimpedance of about 200 Ohms may be obtained with the first stage, and a voltage gain of about two may be achieved with each common-source stage. Other embodiment may have fewer or more stages.

As described earlier, the symmetrical nature of the amplifier stages in FIG. 3 allows for power supply noise to appear as a common mode signal in $V_{REF}$ and the voltage at node 307, so that the differential amplifier latches may reject this noise. The amplifier of FIG. 3 may be viewed as comprising two transimpedance amplifiers, where one transimpedance amplifier comprises the first three stages on the right hand side of FIG. 3, and the other transimpedance amplifier comprises the first three stages on the left hand side of FIG. 3. Furthermore, because the transimpedance amplifier on the left hand side of FIG. 3 may be viewed as having a zero input signal current, the voltage reference $V_{REF}$ provides a threshold by which a "1" or "0" is declared upon comparing $V_{REF}$ with the voltage at node 307 provided by the transimpedance amplifier on the right hand side. With this in mind, we now describe the differential amplifier latches, and their operation, in more detail.

The differential amplifier latches are clocked by a clock signal, which has been denoted by φ. The logical (Boolean)

complement of the clock signal is denoted by $\bar{\phi}$. The clock signal and its logical complement are provided to pre-charge input ports 308a and 308b, respectively. When a pre-charge input port is HIGH, its corresponding differential amplifier latch is in a pre-charge phase, and when its pre-charge input port is LOW, the differential amplifier latch is in an evaluation phase.

Figure 6:
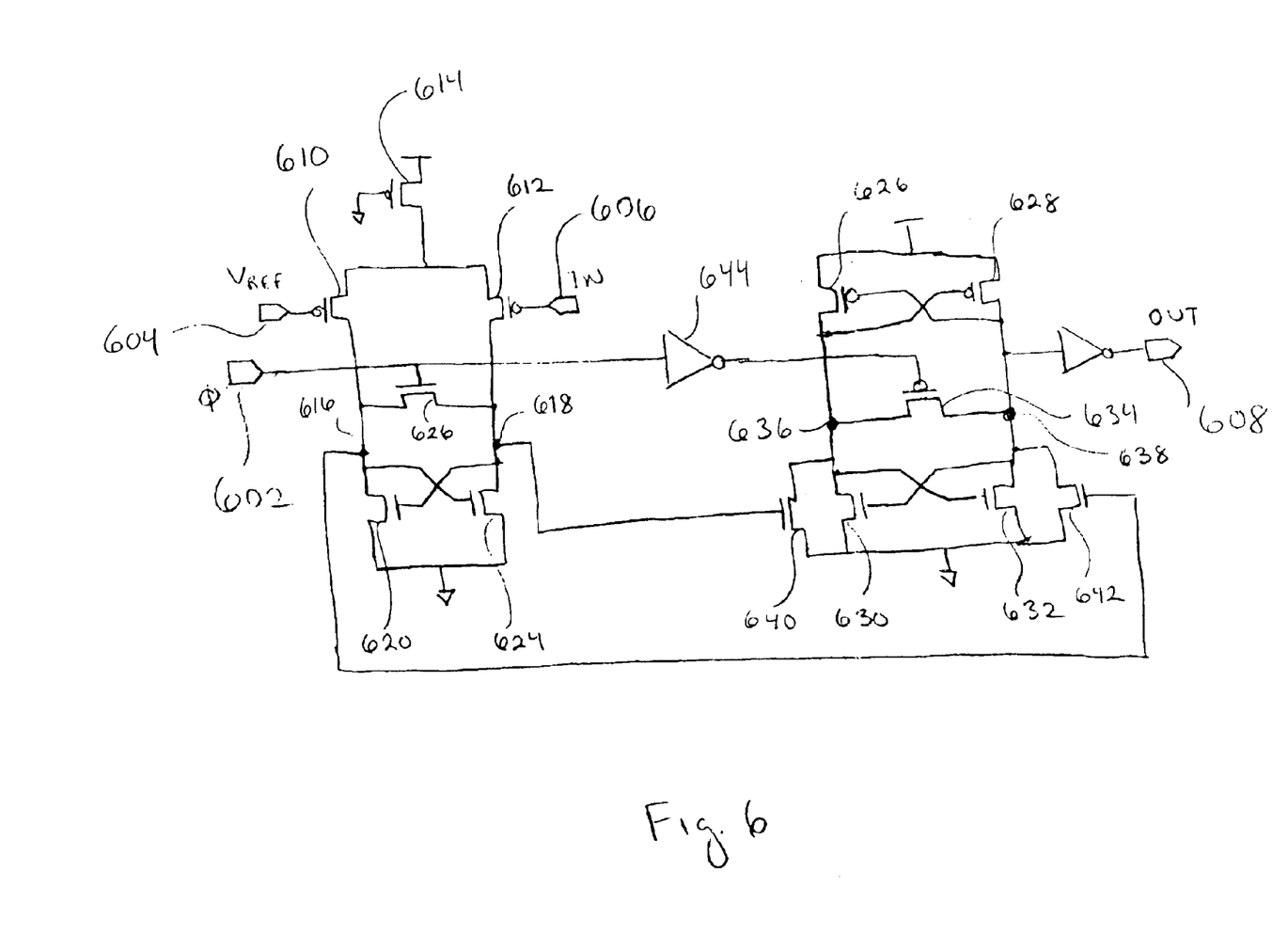
FIG. 6 is a circuit of a differential amplifier latch used in the circuit of FIG. 3.

An embodiment of a differential amplifier latch at the circuit level is provided in FIG. 6. The clock signal is provided to pre-charge input port 602, the reference voltage $V_{REF}$ at node 305 of FIG. 3 is provided to reference input port 604, and the voltage developed at node 307 of FIG. 3 is provided to input port 606. The logical output voltage is provided at output port 608.

The differential amplifier latch of FIG. 6 has two stages. In the first stage, differential transistor pair 610 and 612 have their gates connected to input ports 604 and 606, respectively. Transistor 614 provides bias current to differential transistor pair 610 and 612, and comprises a pMOSFET with its gate connected to ground. A differential output voltage of the first stage may be considered as being provided at nodes 616 and 618. Transistors 620 and 624 provide a half-latch function to pull one of nodes 616 and 618 LOW, depending upon which node develops the lowest voltage first. During a pre-charge phase, pre-charge transistor 626 is switched ON to equalize the voltages at nodes 616 and 618. During an evaluation phase, pre-charge transistor 626 is OFF so that a differential voltage may develop at nodes 616 and 618, depending upon the input differential voltage at input ports 604 and 606.

The second stage of the differential amplifier latch in FIG. 6 comprises two cross-coupled inverters, comprising transistors 626, 628, 630, and 632, to form a full latch. During a pre-charge phase when pre-charge transistor 634 is ON, the voltages at nodes 636 and 638 are equalized. During an evaluation phase when pre-charge transistor 634 is OFF, a differential voltage develops at nodes 636 and 638, depending upon how differential transistor pair 640 and 642 are driven by the differential voltage developed by the first stage at nodes 616 and 618. The full latch amplifies this differential voltage to the logic levels. The state of the latch in the second stage is indicated by the output voltage at output node 608. Delay element (inverter) 644 is introduced in the signal path for the clock signal so that the second stage evaluates only after the first stage has resolved.

Because the differential amplifier latch has a pre-charge phase and an evaluation phase, it is clocked by the clock signal $\phi$. However, it may be desirable to operate the amplifier of FIG. 3 at twice the clock frequency. For example, a 10 GHz clock signal would allow only a 10 Gbps data rate if one differential amplifier latch were to be employed. Consequently, the embodiment of FIG. 3 employs two differential amplifier latches, where each one is clocked 180 degrees out of phase with respect to the other one. As a result, a 20 Gbps data rate may be received by the amplifier of FIG. 3. The two output voltages $V_{OUT1}$ and $V_{OUT2}$ of the two differential amplifier latches may be provided at a single output port on alternate edges of the clock signal, as shown in FIG. 7. For simplicity, FIG. 7 does not replicate all of FIG. 3, but shows that the output ports of differential amplifier latches 306a and 306b are connected to transmission gates 702a and 702b, respectively. The output voltage is provided at output port 704.

In practice, input port 302 of the transimpedance amplifier in FIG. 3 need not be connected directly to the output port of a photodetector or other detector. For example, there may be an analog filter, such as a channel equalization filter, between input port 302 and the output port of a photodetector.

Figure 8:
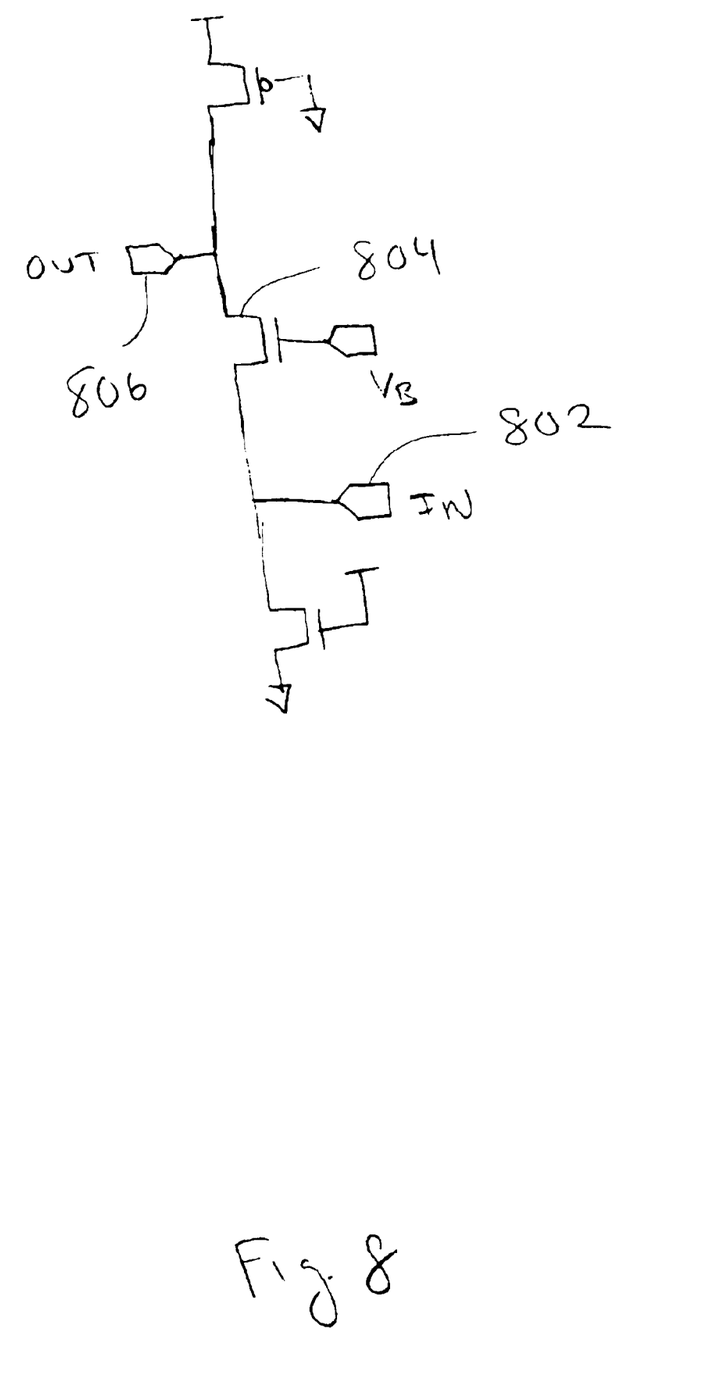
FIG. 8 is the dual or complementary of the circuit in FIG. 4.

Many modifications may be made to the disclosed embodiments without departing from the scope of the invention as claimed below. For example, it is well known that many circuits employing MOSFETs have a "dual" or "complementary", where some or all pMOSFETs are replaced by nMOSFETs, and some or all nMOSFETs are replaced by pMOSFETs. For example, referring to the, first stage of the transimpedance amplifier in FIG. 4, a dual is easily synthesized, as shown in FIG. 8, where now input port 802 is provided to the source of nMOSFET 804, and output port 806 is taken at the drain of nMOSFET 804. Similar modifications may be made to other circuits described in this specification. Furthermore, although the two transimpedance amplifiers in the amplifier of FIG. 3 each comprises three stages, other embodiments may be realized in which more or fewer stages are employed for each transimpedance amplifier. Furthermore, different types of amplifier stages may be employed.

What is claimed is:

1. An amplifier comprising an input port to receive a current signal, the amplifier comprising:
   a first transimpedance amplifier to provide an output voltage indicative of the received current signal;
   a second transimpedance amplifier to provide a reference voltage; and
   a first differential amplifier latch to provide during an evaluation phase an output logic voltage indicative of whether the output voltage of the first transimpedance amplifier is greater or lesser than the reference voltage;
   wherein the first and second transimpedance amplifiers are in close proximity to each other so that power supply noise is a common mode signal in the reference voltage and in the output voltage of the first transimpedance amplifier.

2. The amplifier as set forth in claim 1, wherein the first and second transimpedance amplifiers are identical in circuit layout.

3. The amplifier as set forth in claim 1, further comprising:
   a second differential amplifier latch to provide during an evaluation phase an output logic voltage indicative of whether the output voltage of the first transimpedance amplifier is greater or lesser than the reference voltage;
   wherein the first and second differential amplifiers are coupled so as to enter their respective evaluation phases on alternate transitions of a clock signal.

4. A die comprising:
   a ground rail;
   a power rail;
   an amplifier comprising
      an input port to receive a current signal;
      a first output port to provide an output voltage indicative of the current signal;
      a second output port to provide a reference voltage;
      a first transimpedance amplifier comprising
         a first common-gate transistor comprising a drain coupled to the first output port, and a source connected to the input port;
         a first pMOSFET bias transistor comprising a drain connected to the source of the first common-gate transistor, and a gate connected to the ground rail; and a first uMOSFET bias transistor comprising a drain connected to the drain of the first common-gate transistor, and a gate connected to the power rail;

a second transimpedance amplifier comprising a second common-gate transistor comprising a drain coupled to the second output port, and a source, a second pMOSFET bias transistor comprising a drain connected to the source of the second common-gate transistor, and a gate connected to the ground rail; and a second nMOSFET bias transistor comprising a drain connected to the drain of the second common-gate transistor, and a gate connected to the power rail; and a first differential amplifier latch to provide an output logic voltage during an evaluation phase indicative of comparing the reference voltage with the output voltage.

5. The die as set forth in claim 4, wherein the first transimpedance amplifier further comprises at least one voltage amplifier stage comprising an input port connected to the drain of the first common-gate transistor and an output port to provide the output voltage; and the second transimpedance amplifier further comprises at least one voltage amplifier stage comprising an input port connected to the drain of the second common-gate transistor and an output port to provide the reference voltage.

6. The die as set forth in claim 5, the amplifier further comprising:

a second differential amplifier latch to provide an output logic voltage during an evaluation phase indicative of whether the output voltage of the first transimpedance amplifier is greater or lesser than the reference voltage;

wherein the first and second differential amplifiers are coupled so as to enter their respective evaluation phases on alternate transitions of a clock signal.

7. The die as set forth in claim 4, the amplifier further comprising:

a second differential amplifier latch to provide an output logic voltage during an evaluation phase indicative of whether the output voltage of the first transimpedance amplifier is greater or lesser than the reference voltage;

wherein the first and second differential amplifiers are coupled so as to enter their respective evaluation phases on alternate transitions of a clock signal.

8. A computer system comprising:

a photodetector comprising an output port; and an amplifier comprising an input port to receive a current signal, the amplifier comprising:

a first transimpedance amplifier to provide an output voltage indicative of the received current signal;

a second transimpedance amplifier to provide a reference voltage; and a first differential amplifier latch to provide during an evaluation phase an output logic voltage indicative of whether the output voltage of the first transimpedance amplifier is greater or lesser than the reference voltage;

wherein the first and second transimpedance amplifiers are in close proximity to each other so that power supply noise is a common mode signal in the reference voltage and in the output voltage of the first transimpedance amplifier.

9. The computer system as set forth in claim 8, wherein the first and second transimpedance amplifiers are identical in circuit layout.

10. The computer system as set forth in claim 8, the amplifier further comprising:

a second differential amplifier latch to provide during an evaluation phase an output logic voltage indicative of whether the output voltage of the first transimpedance amplifier is greater or lesser than the reference voltage;

wherein the first and second differential amplifiers are coupled so as to enter their respective evaluation phases on alternate transitions of a clock signal.

11. An amplifier comprising:

a first transimpedance amplifier comprising an input port and an output port to provide a output voltage at its output port indicative of a signal current at its input port;

a second transimpedance amplifier identical in circuit layout to the first transimpedance amplifier, wherein the second transimpedance amplifier comprises an input port and an output port corresponding to the input port and the output port of the first transimpedance amplifier, respectively, wherein the input port of the second transimpedance amplifier receives no signal current and the output port of the second transimpedance amplifier provides a reference voltage; and a first differential amplifier latch to provide during an evaluation phase an output logic voltage indicative of whether the output voltage of the first transimpedance amplifier is greater or lesser than the reference voltage.

12. The amplifier as set forth in claim 11, wherein the first and second transimpedance amplifiers have a symmetrical layout so that power supply noise is a common mode signal in the reference voltage and in the output voltage of the first transimpedance amplifier.

13. The amplifier as set forth in claim 12, further comprising:

a second differential amplifier latch to provide during an evaluation phase an output logic voltage indicative of whether the output voltage of the first transimpedance amplifier is greater or lesser than the reference voltage;

wherein the first and second differential amplifiers are coupled so as to enter their respective evaluation phases on alternate transitions of a clock signal.

14. An amplifier comprising:

a first transimpedance amplifier comprising an input port and an output port to provide a output voltage at its output port indicative of a signal current at its input port;

a second transimpedance amplifier identical in circuit layout to the first transimpedance amplifier, wherein the second transimpedance amplifier comprises an input port and an output port corresponding to the input port and the output port of the first transimpedance amplifier, respectively, wherein the input port of the second transimpedance amplifier receives no signal current and the output port of the second transimpedance amplifier provides a reference voltage; and wherein the first and second transimpedance amplifiers have a symmetrical layout so that power supply noise is a common mode signal in the reference voltage and in the output voltage of the first transimpedance amplifier.

* * * * *

UNITED STATES PATENT AND TRADEMARK OFFICE
CERTIFICATE OF CORRECTION

PATENT NO. : 6,771,131 B2
DATED : August 3, 2004
INVENTOR(S) : Wilson et al.

It is certified that error appears in the above-identified patent and that said Letters Patent is hereby corrected as shown below:

Title page,
Item [75], Inventors, delete "Tanay Karnick" and insert -- Tanay Karnik --.

Column 1,
Lines 1-2, delete "CM OS AMPLIFIER FOR OPTOELECTRONIC RECEIVERS" and insert -- CMOS AMPLIFIER FOR OPTOELECTRONIC RECEIVERS --.

Column 6,
Line 10, delete "the," and insert -- the --.

Column 7,
Line 1, delete "uMOSFET" and insert -- nMOSFET --.

Signed and Sealed this

Twenty-first Day of December, 2004

JON W. DUDAS
*Director of the United States Patent and Trademark Office*